United States Patent
Powell et al.

Patent Number: 5,915,194
Date of Patent: Jun. 22, 1999

[54] METHOD FOR GROWTH OF CRYSTAL SURFACES AND GROWTH OF HETEROEPITAXIAL SINGLE CRYSTAL FILMS THEREON

[75] Inventors: J. Anthony Powell, North Olmsted; David J. Larkin, Valley City; Philip G. Neudeck, Olmsted Falls; Lawrence G. Matus, Amherst, all of Ohio

[73] Assignee: The United States of America as represented by the Administrator of National Aeronautics and Space Administration, Washington, D.C.

[21] Appl. No.: 08/887,804

[22] Filed: Jul. 3, 1997

[51] Int. Cl.[6] .................................................. H01L 21/306
[52] U.S. Cl. ............................................ 438/478; 438/931
[58] Field of Search ..................................... 438/478, 507, 438/503, 504, 931

[56] References Cited

U.S. PATENT DOCUMENTS

| | | |
|---|---|---|
| 5,248,385 | 9/1993 | Powell ..................................... 438/507 |
| 5,363,800 | 11/1994 | Larkin et al. ........................... 438/507 |
| 5,463,978 | 11/1995 | Larkin . | |

OTHER PUBLICATIONS

Recent Progress in SiC Crystal Growth 111 Paper presented at Silicon Carbide and Related Materials 1995 Conf., Kyoto, Japan, 1996 by V. F. Tsvetkov, S. T. Allen, H. S. Kong and C. H. Carter, Jr.

Extremely Flat Layer Surfaces in Liquid Phase Epitaxy of GaAs and AlxGa1–xAs . . . Journal of Crystal Growth 87 (1988) in North–Holland, Amsterdam by U. Murlock, M. Kelsch and E. Bauser.

Control of the polytypes (3C,2H) of silicon carbide thin films deposited on pseudomorphic aluminum nitride (0001) surfaces . . . Inst. Phys. Conf. Ser. No. 142; Chapter 1 presented at Silicon Carbide and Related Maerials 1995 Conf . . . Kyoto, Japan.

Initial stages of growth of Sic and AlN thin films on vicinal and on–axis surfaces of 6H–Sic(0001) . . . presented at Silicon Cardide and Related Materials 1995 Conf . . . Kyoto, Japan.

Nucleartion and Step motion in chemical vapor deposition of SiC on 6H–SiC(0001) faces. 1994 American Institute of Physics, Dec. 1994 by Tsunenobu Kimoto and Hiroyuki Matsinami.

*Primary Examiner*—Charles Bowers
*Assistant Examiner*—Keith Christianson
*Attorney, Agent, or Firm*—Kent N. Stone

[57] ABSTRACT

A method of growing atomically-flat surfaces and high-quality low-defect crystal films of polytypic compounds heteroepitaxially on polytypic compound substrates that are different than the crystal film. The method is particularly suited for the growth of 3C-SiC, 2H-AlN, and 2H-GaN on 6H-SiC.

24 Claims, 8 Drawing Sheets

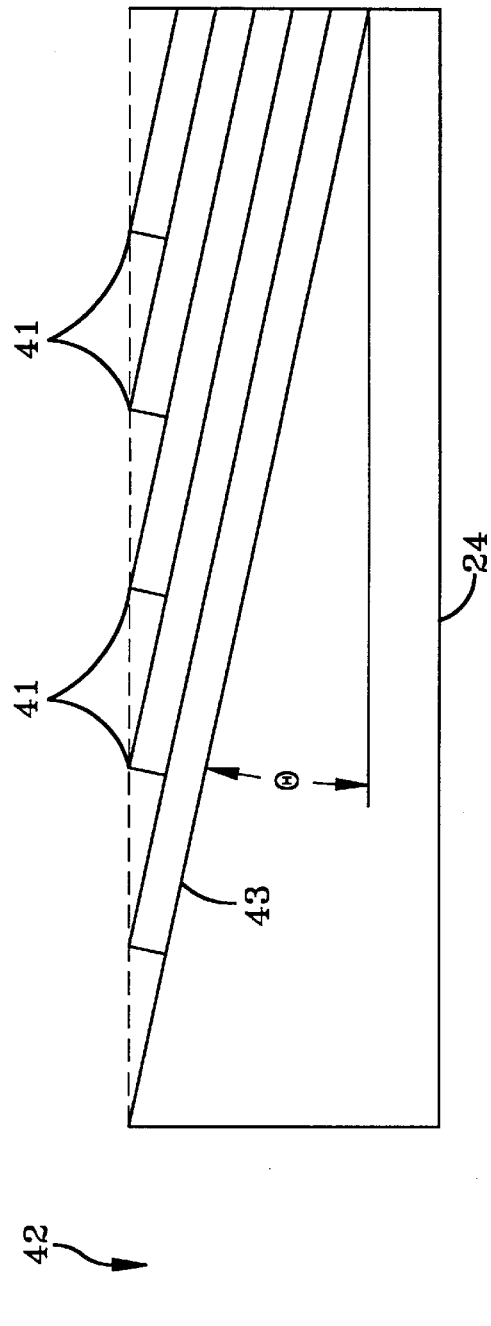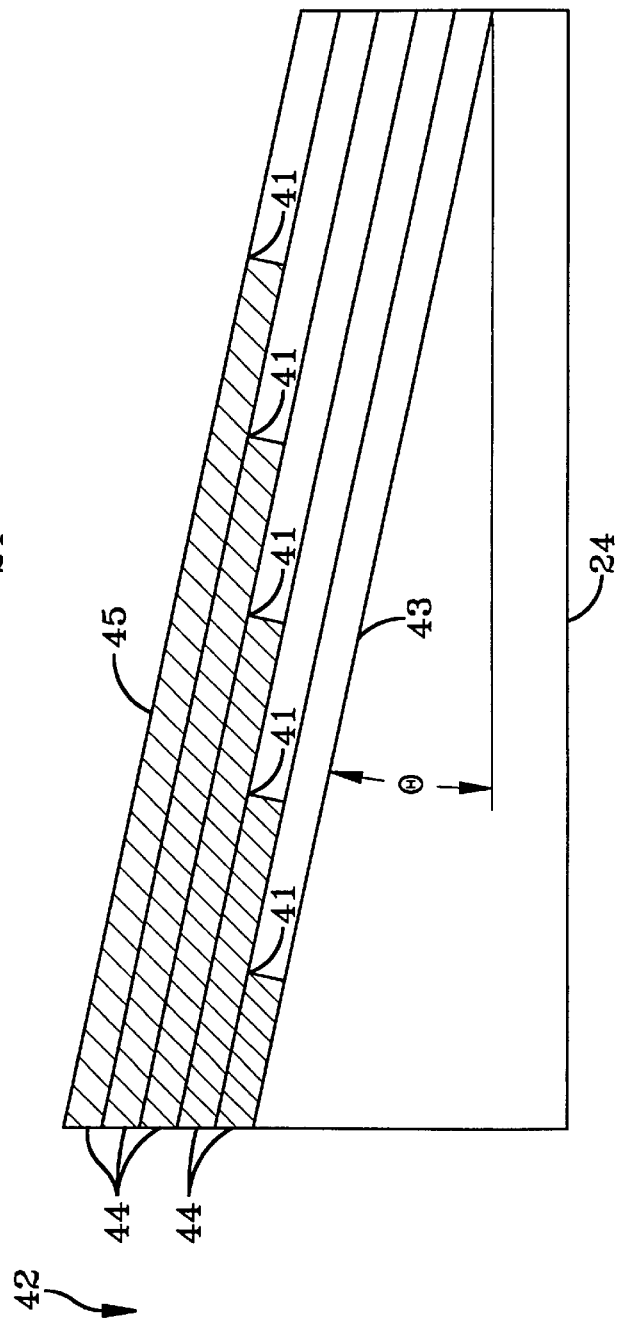

METHOD FOR GROWTH OF CRYSTAL SURFACES AND GROWTH OF HETEROEPITAXIAL SINGLE CRYSTAL FILMS THEREON

ORIGIN OF THE INVENTION

The invention described herein was made by employees of the United States Government and may be used by or for the Government for governmental purposes without payment of any royalties thereon or therefor.

FIELD OF THE INVENTION

The invention relates to the growth of semiconductor device crystal films, and more particularly, to a method for producing atomically-flat crystalline surfaces and high-quality films of silicon carbide (SiC), aluminum nitride (AlN), gallium nitride (GaN), and other materials or compounds. The semiconductor devices find application in high power, high frequency, high temperature and high radiation environments, as well as use in optoelectronic devices such as lasers and light-emitting diodes.

BACKGROUND OF THE INVENTION

This invention relates to the controlled growth of atomically-flat crystalline surfaces and crystal films for application to the fabrication of semiconductor devices. The invention is particularly applicable to the production of crystals (herein used to include crystal films) of silicon carbide, aluminum nitride, gallium nitride, and other compounds. A primary aspect of the invention is related to silicon carbide (SiC) and the nitrides (e.g., AlN and GaN) of the Group III elements; however, the invention has much broader applications and can be used for other compounds. For example, films of ternary and quarternary compounds (and higher order compounds) of the III-V elements (e.g., GaAlN) could be grown.

The invention is also particularly applicable to growing atomically-flat surfaces. The ability to prepare device-sized regions of atomically-flat, or nearly atomically-flat, regions on a semiconductor crystal leads to improved performance and reliability in devices such as Metal Insulator Semiconductor Field Effect Transistor (MISFET) devices known in the art. In MISFET-based transistor devices, the electrical potential of the gate influences the density of carriers (either electrons or holes) in the underlying channel region between the source and drain contacts of the MISFET, thereby modulating source-to-drain current flow. The insulator properties and thickness are chosen so as to prevent current flow of mobile carriers between the channel and the gate, yet enable the electrical potential of the gate to affect the electrical potential, and therefore the number of carriers in the source-to-drain channel, which, in turn, modulates the source-to-drain current flow.

In general, MISFET's can be divided into two sub-categories: 1) buried channel MISFET's in which majority carrier current flow takes place well below the insulator-semiconductor interface (approximately a Debeye Length (known in the art) into the semiconductor below the semiconductor-insulator interface), and 2) surface channel MISFET's where the vast majority of transistor current flow takes place just on the semiconductor side of the insulator-semiconductor interface. The very thin, high density layer of mobile carriers localized at the insulator-semiconductor interface in a surface-channel MISFET is often referred to as an "inversion layer" or "2 Dimensional Electron Gas layer."

The most commonly employed sub-category of surface-channel MISFET devices is the inversion-channel MOSFET (Metal Oxide [$SiO_2$] Semiconductor Field Effect Transistor) which is the basic building block device for the vast majority of semiconductor integrated circuits on the market today. Another useful sub-category of surface-channel MISFET is known as the High Electron Mobility Transistor, or HEMT. Instead of using a true dielectric insulator such as $Sio_2$, the HEMT structure often employs a wider-bandgap semiconductor to serve as the "insulator" that resides between the gate and a narrower-bandgap semiconductor channel.

It is well-known to those skilled in the art that the electrical performance and reliability of surface channel MISFET's are greatly impacted by. the quality of the insulator-semiconductor interface, especially its flatness dimension. In order to maximize transistor gain and current-carrying capability, it is desired that the effective mobility of carriers in the surface channel (i.e., inversion layer) be maximized. Spacial non-uniformities in the insulator-semiconductor interface (i.e., interface non-flatness) have repeatedly been shown to hinder the acceleration and flow of carriers in surface-channel MISFET inversion layers leading to reduced effective channel carrier mobilities which, in turn, cause decreased transistor gain and reduced current carrying capability. Furthermore, it is also well-known and well-documented that interface non-flatness (more commonly referred to as interface roughness) also impacts long-term reliability of MISFET's, particularly in MOSFET devices where high electric fields or high temperatures are encountered.

From a structural point of view, the ideal insulator-semiconductor interface in any MISFET structure is one that is atomically-flat along the interface, and is atomically abrupt across the interface in that the last monolayer of 100% semiconductor is immediately followed by the first monolayer of 100% insulator (i.e., no transitional monolayer of 50% insulator 50% semiconductor for example). The term "atomically-flat" is known in the art and is generally referred to herein as meaning a surface that is totally without any atomic-scale or macro-scale steps over an area defined by selected boundaries that may be created by grooves in a manner to be further described herein with reference to FIG. 4. The present invention, as will be described hereinafter, provides methodologies for obtaining large areas of atomically-flat surfaces, as well as atomically abrupt defect-free interfaces between two materials with different electrical properties, both of which could be employed in the fabrication of improved structurally ideal MISFET devices.

The formation of atomically-flat surfaces for a MISFET device in and of itself could in many cases be used to improve MISFET performance. More particularly, any insulator layer placed on top of the semiconductor as part of a MISFET process, regardless of deposition or thermal growth method, would likely have better (though not necessarily atomically-flat) interface roughness properties if starting from a relatively flat substrate prepared in accordance with the present invention, as to be described, rather than starting from a prior art substrate. In the case of inversion-channel MOSFET's superior smoothness is likely to be present after a thermal oxidation starting from an atomically-flat surface, prepared according to the present invention, which could improve effective inversion channel carrier mobilities, MOSFET gain and peak current, and improve MOSFET oxide reliability under real-world high-field and/or high-temperature operating conditions. While the above discussion has been directed primarily to surface-channel MISFET devices, the principles of this invention could be used to improve any structure that is impacted by the atomically flatness and/or atomically abruptness of a material junction, including homojunction semiconductor devices.

Semiconductor devices, including MISFET devices all related to the present invention, are used in a wide variety of electronic applications. Semiconductor devices include diodes, transistors, integrated circuits, sensors, and opto-electronic devices such as light-emitting diodes and diode lasers. Various semiconductor devices using silicon or compound semiconductors such as gallium arsenide (GaAs) and gallium phosphide (GaP) are commonly used. In order to fabricate semiconductor devices, it is necessary to be able to grow high-quality, low-defect-density single-crystal films with controlled impurity incorporation while possessing good surface morphology. The substrate upon which the film is grown should also be a high-quality, low-defect-density single crystal. In recent years, there has been an increasing interest in research on wide-bandgap semiconductors for use in high temperature, high power, high frequency, and/or high radiation operating conditions under which silicon and conventional III-V semiconductors cannot adequately function. Particular research emphasis has been placed on SiC, AlN, and GaN. It is believed by many experts that SiC will have advantages for high power applications because of its high breakdown electric field, high thermal conductivity, and GaN will have advantages for opto-electronic applications because of its wide direct bandgap. The recent development of commercial very bright blue GaN light emitting diodes (LED's) has spurred the world wide development efforts to produce blue and/or ultraviolet (uv) GaN laser diodes particularly suited for increased data capacity in digital optical storage media such as compact disc (CD) players.

Silicon carbide has characteristics that make it highly advantageous for applications involving high temperature, high power, high frequency, and/or high radiation operating conditions. Such characteristics include a wide energy band-gap of 2.2 to 3.3 electron volts (depending on polytype), a high thermal conductivity, a high breakdown electric field, a high saturated electron drift velocity, and high dissociation temperature. Furthermore, silicon carbide is thermally, chemically and mechanically stable and has a great resistance to radiation damage. A variety of silicon carbide semiconductor devices have been fabricated and operated to temperatures exceeding 600° C.

Several properties of SiC make crystal growth difficult. First, Sic does not melt at reasonable pressures and it sublimes at temperatures above 1800° C. Second, Sic grows in many different crystal structures, called polytypes. Since melt-growth techniques cannot be applied to SiC, two techniques have been developed to grow SiC crystals. The first technique is known as chemical vapor deposition (CVD) in which reacting gases are introduced into a growth chamber to form SiC crystals on an appropriate heated substrate. A second technique for growing SiC crystals is generally referred to as the sublimation process (or modified sublimation process). In the sublimation technique, some type of solid SiC material other than the desired single crystal in a particular polytype is used as a starting material and heated until the solid SiC sublimes. The vaporized material is then condensed onto a seed crystal to produce the desired bulk single crystal. The sublimation process is still far from perfect because it produces many defects in the bulk crystal. A very serious defect is a tubular void (known as a micropipe), on the order of a micrometer in diameter, which propagates in the direction of growth. The density of micropipes in state-of-the-art commercial crystals is on the order of 100 $cm^{-2}$ and these are known to cause undesired premature electrical breakdown in pn junctions. Line dislocations also are produced in these bulk crystals at density of about $10^4$ $cm^{-2}$ and these dislocations are believed to contribute to undesirable leakage currents in reversed-biased pn junctions.

Silicon carbide crystals exist in hexagonal, rhombohedral and cubic crystal structures. Generally, the cubic structure, with the zincblende structure, is referred to as β-siC or 3C-SiC, whereas numerous polytypes of the hexagonal and rhombohedral structures are collectively referred to as α-SiC. To our knowledge, only bulk (i.e., large) crystals of the α polytypes have been grown to date; the β (or 3C) polytype can only be obtained as small (less than 1 $cm^2$) blocky crystals or thick epitaxial films on small 3C substrates or crystal films grown heteroepitaxially on some other substrate. The most commonly available α-SiC polytypes are 4H-SiC and 6H-SiC; these are commercially available as polished wafers, presently up to 35 mm in diameter. Each of the SiC polytypes has its own specific advantages over the others. For example, (1) 4H-SiC has a significantly higher electron mobility compared to 6H-SiC; (2) 6H-SiC is used as a substrate for the commercial fabrication of GaN blue light-emitting diodes (LED's); and (3) 3C-SiC has a high electron mobility similar to that of 4H and may function over wider temperature ranges, compared to the α polytypes.

Silicon carbide polytypes are formed by the stacking of double layers of Si and C atoms. Each double layer may be situated in one of three positions, known as A, B, and C. The sequence of stacking determines the particular polytype; for example, the repeat sequence for 3C is ABCABC . . . (or ACBACB . . . ), the repeat sequence for 4H is ABACABAC . . . , and the repeat sequence for 6H is ABCACBABCACB . . . . From this it can be seen that the number in the polytype designation gives the number of double layers in the repeat sequence and the letter denotes the structure type (cubic, hexagonal, or rhombohedral). The stacking direction is designated as the crystal c-axis and is in the crystal [0001] direction; it is perpendicular to the basal plane which is the crystal (0001) plane. The {111} planes of the cubic structure are equivalent to the (0001) plane of the α polytypes. The SiC polytypes are polar in the <0001> directions: in one direction, the crystal face is terminated with silicon (Si) atoms; in the other direction, the crystal face is terminated with carbon (C) atoms. These two faces of the (0001) plane are known as the Si-face and C-face, respectively. As used herein, "basal plane" shall refer to either the (0001) plane for a α-sic, or the (111) plane of 3C-SiC. The term "vicinal (0001) wafer" shall be used herein for wafers whose polished surface (the growth surface) is misoriented less than 8° from the basal plane. The angle of misorientation shall be referred to herein as the tilt angle. The term "homoepitaxial" shall be referred to herein as epitaxial growth, whereby the film and the substrate (wafer) are of the same polytype and material, and the term "heteroepitaxial" shall be referred to herein as epitaxial growth whereby the film is of a different polytype or material than the substrate.

As of now, to our knowledge, there is no existing method for producing large (greater than 1-inch diameter) high-quality single-crystal 3C-SiC boules. Hence, no acceptable-quality 3C-SiC wafers are available. In a prior art process, single-crystal homoepitaxial 6H-SiC films can be grown on vicinal 6H-SiC substrates with tilt angles in the range 0.1° to 6° in the temperature range 1400° C. to 1600° C. by chemical vapor deposition (CVD) if the surface is properly prepared in a manner more fully described in U.S. Pat. No. 5,248,385 which is herein incorporated by reference. In addition to homoepitaxial 6H-SiC on 6H-SiC, 3C-SiC can be heteroepitaxially grown on 6H-SiC (or other α-SiC) substrates with tilt angles less than 1°. However, this generally results in 3C-SiC films which have defects known as double positioning boundaries (DPB's). The DPB's can arise because of the change in stacking sequence of the 6H-SiC wafer (i.e., ABCACB . . . ) to that of 3C-SiC (ABC . . . or ACB . . . ) at the interface between the two polytypes. The difference between the two 3C sequences is a 60° rotation about the <111> axis. If both of these two sequences nucleate on the 6H-SiC substrate, DPB's will form at the boundary of the domains containing the two sequences.

Theories explaining epitaxial single-crystal growth are well known. Crystal growth can take place by several mechanisms. Two of these are: (1) growth can take place by the lateral growth of existing atomic-scale steps on the surface of a substrate, and (2) growth can take place by the formation of two-dimensional atomic-scale nuclei on the surface followed by lateral growth from the steps formed by the nuclei. The lateral growth from steps is sometimes referred to as "step-flow growth." In the first mechanism, growth proceeds by step flow from existing steps without the formation of any two-dimensional nuclei (i.e., without 2D nucleation). In the nucleation mechanism, the nucleus must reach a critical size in order to be stable; in other words, a potential energy barrier must be overcome in order for a stable nucleus to be formed. Contamination or defects on the substrate surface can lower the required potential energy barrier at a nucleation site. In the processes described in this invention, crystal growth proceeds by (1) step flow without 2D nucleation, or by (2) step flow with 2D nucleation. Step flow growth with 2D nucleation allows the growth of epitaxial films of any desired thickness.

A prior art process for growing 3C-SiC on 6H-SiC with reduced density of DPB's is presented in U.S. Pat. No. 5,363,800 ('800) which is herein incorporated by reference. In this improved process, the surface of a 6H-SiC substrate with a tilt angle of less than 1° is divided up into an array of selected regions (herein called mesas) that are separated from one another by grooves. Each mesa acts as an independent substrate. In the process of the '800 patent, nucleation of 3C-SiC is caused to occur at the topmost atomic plane of each mesa, preferably at one corner of the mesa, and then 3C-SiC grows laterally from this point and eventually covers the whole mesa. It is assumed in this process of the '800 patent that the vicinity of the topmost plane of each mesa is atomically flat and is thus a preferred site for 3C-SiC nucleation. This prior art process of the '800 patent appears to have several disadvantages. First, it does not give any reproducible method for causing 3C-SiC to nucleate at the desired location on each mesa. Second, the 3C-SiC nucleation takes place when there are still atomic-scale steps on the mesa; these steps can act as nucleation sites for 3C-SiC if there are defects or contamination present on the surface. And finally, although the density of DPB's and associated stacking fault are greatly reduced, stacking fault density due to other causes appear to be still very high.

Using other prior art growth techniques, we have observed the nucleation of a large density of two-dimensional islands on 6H-SiC substrates in crystal growth experiments using chemical vapor deposition (CVD). In growth experiments by Kimoto and Matsunami on "well-oriented" (i.e., very small tilt angles with respect to the basal plane) Sic substrates over the temperature range 1200° C. to 1600° C., nucleation densities in the range $4 \times 10^3$ to $1 \times 10^6$ $cm^{-2}$ were observed. In these same experiments, Kimoto and Matsunami observed 3C-SiC nuclei with two different rotational orientations growing on the "well-oriented" 6H-SiC substrates. The experiments of Kimoto and Matsunami are disclosed in the technical article "Nucleation and Step Motion in Chemical Vapor Deposition of SiC on 6H-SiC {0001} Faces," by T. Kimoto and H. Matsunami, published in *J. Applied Physics*, Vol. 76, No. 11, pp.7322–7327 (1994), and which is herein incorporated by reference.

As discussed above, 3C-SiC, to our knowledge, is not available in high-quality single-crystal wafer form; hence, the epitaxial 3C-SiC device structures must be grown heteroepitaxially on some other material. The present invention overcomes the problems of prior art in the growth of high-quality low-defect 3C-SiC films on 6H-SiC substrates.

In addition to non-availability of high-quality 3C-SiC single-crystal wafers, other wide-bandgap semiconductor compounds that are not available in single-crystal wafer form and which have great commercial potential are the nitrides of aluminum and gallium. Gallium nitride (GaN), in particular, has great potential as an optoelectronic material. Currently, commercial light-emitting diodes are being fabricated by growing GaN films on 6H-SiC or sapphire substrates. Even though these films have extremely high defect density (typically around $10^{10}$ $cm^{-2}$), very bright and efficient LED's can be fabricated. Pulsed blue lasers have been fabricated from GaN; continuous blue lasers that operate for a brief time before failure have been fabricated. The present invention provides a means for reducing defects in the GaN films and hence make a practical continuous-duty GaN laser possible.

In prior art growth experiments reported by Davis et al in a technical article entitled "Initial Stages of Growth of Sic and AlN Thin Films on Vicinal and On-axis Surfaces of 6H-SiC (0001)," published in *Inst. Phys. Conf. Ser*. No. 142, Chapter 1, page 133 (which is herein incorporated by reference), low-defect films of 3C-SiC and 2H-AlN were grown on terraces on "on-axis" (i.e., low tilt angle) 6H-SiC substrates. The films were grown by gas-source molecular beam epitaxy (GSMBE) and had thicknesses of less than 2 nm. In other prior art experiments by the same research group and reported by Tanaka et al in a technical article entitled "Control of the Polytypes (3C, 2H) of Silicon Carbide Thin Films Deposited on Pseudomorphic Aluminum Nitride (0001) Surfaces," published in *Inst. Phys. Conf. Ser*. No. 142; Chapter 1, page 109 (herein incorporated by reference), 3C-SiC and 2H-SiC were grown by GSMBE on the thin films of 2H-AlN on "on-axis" 6H-SiC substrates. The C/Si ratio of the input gases determined the polytype of the SiC film: C/Si=1 yielded 3C-SiC and C/Si=5 yielded 2H-SiC. Very few defects were observed in films grown on the on-axis substrates compared to films grown on off-axis (i.e., 3° tilt angle) substrates. A possible drawback with these experiments is that the results were obtained on atomic-scale terraces on the on-axis substrates. We do not have any knowledge of any method of making these atomic-scale results applicable to larger useful device-sized regions of the substrates. Also, there is no discussion by Davis et al of the impact of defects in the SiC substrates on the quality of the crystal films.

In another prior art process reported by Morlock et al., entitled "Extremely Flat Layer Surfaces in Liquid Phase Epitaxy of GaAs and $Al_xGa_{1-x}As$" by U. Morlock, M. Kelsch, and E. Bauser, published in *J. Crystal Growth*, Vol. 87, pp.343–349 (1988), which is herein incorporated by reference, extremely flat surfaces were produced on mesas up to 1 $mm^2$ in size on GaAs and AlGaAs substrates by a liquid phase epitaxy (LPE) process. These flat surfaces appeared as facets on the top of the mesas. Although the surfaces were extremely flat, from our understanding the surfaces actually consisted of very shallow hillocks where the center of each hillock was a dislocation that acted as a continuous source of steps. Accordingly, each mesa was covered with monomolecular steps emanating from the numerous localized step sources. The terrace width (distance between steps) varied from 0.5 to 50 μm.

A disadvantage of prior art processes for the growth of SiC epilayers on SiC substrates (e.g., homoepitaxial growth of 6H-SiC on 6H-SiC) is that the step-flow growth employed in growth on "off-axis" commercial wafer can result in epilayers with large surface steps (tens of nanometers high) formed by the "step bunching" of smaller atomic-scale steps (approximately 1 nanometer high). These steps may very well hinder the development and operation of small scale devices which are of concern to the present invention.

SUMMARY OF THE INVENTION

The practice of the present invention particularly related to atomically-flat crystalline surfaces and crystal films is partially based on our discovery of three factors: (1) two-dimensional crystal nucleation can be reduced to zero, or near zero, on the SiC basal plane for selected growth conditions; (2) atomically-flat, or nearly atomically-flat, device-sized surfaces can be grown on the SiC basal plane under these selected growth conditions; and (3) two-dimensional crystal nuclei grown on an atomically-flat basal plane under other selected growth conditions take on only one of two possible rotational orientations. The growth of crystal nuclei with a single rotational orientation on an atomically flat basal plane is one of the bases of our invention for providing a method of growing low-defect crystal film structures.

In general, the invention is a method of producing atomically-flat single-crystal surfaces and low-defect crystal film structures of compounds that are not available in the form of large-area single-crystal substrates. This method is accomplished by utilizing particular homoepitaxial/heteroepitaxial growth processes on a substrate of different material and/or structure than the desired crystal film. The method is comprised of the following steps: first, an array of mesas of desired size is produced on a suitable single-crystal substrate (e.g., 6H-SiC); second, atomically-flat surfaces are produced on the top of each mesa by growing a homoepitaxial film under conditions that allow step-flow growth without significant two-dimensional crystal nucleation on the terraces between steps on the surface; and third, growth conditions are altered such that heteroepitaxial growth is carried out by way of intentional two-dimensional nucleation of the desired film (e.g., 3C-SiC), plus step-flow growth from the two-dimensional nuclei, on the atomically-flat surfaces without interference from defects and steps that existed on the original substrate surface. Additional growth procedures can produce multi-layer doped structures of compounds such as SiC, AlN, and GaN.

Further, the present invention relates to a method of growing high-quality low-defect crystal films of polytypic compounds heteroepitaxially on polytypic compound substrates that are different than the film. As examples, the growth of 3C-SiC, 2H-AlN, and 2H-GaN on 6H-SiC will be described.

In accordance with the principal feature of the invention, there is provided a method for preparing a substrate surface and subsequently growing a low-defect crystal film in an epitaxial growth process on the specially prepared substrate.

In summary, the inventive method is comprised of several steps. First, a SiC substrate is prepared with a planar surface whose orientation is within 1° of the basal (0001) plane. Second, separate growth regions (herein called mesas) are established on the planar surface that are separated from one another by continuous depressions (herein called grooves) in the planar surface. Third, a step-flow homoepitaxial growth of SiC is carried out by the lateral growth of atomic-scale steps that are present on the surface. These steps are caused by the small tilt angle of the polished mesa top relative to the basal plane. The homoepitaxial growth conditions are selected to minimize two-dimensional nucleation on the terraces between steps. It is important in the selection of the substrate and in the preparation of the mesa tops to produce growth surfaces that are free, or nearly free, of contamination, localized sources of step sources (e.g., screw dislocations) and/or other defects (e.g., edge dislocations) since these defects can cause two-dimensional nucleation or can be a continuous source of undesired growth steps. The step-flow homoepitaxial growth is continued until an atomically-flat, or nearly atomically-flat surface is produced across the entirety on each mesa top. Fourth, growth conditions are changed to promote two-dimensional nucleation of the desired heteroepitaxial crystal film on the atomically-flat, or nearly atomically-flat mesas. Conditions can be established that promote two-dimensional nucleation over the whole mesa or at selected locations on the mesa. Step-flow growth takes place from the two-dimensional nuclei. This growth is continued by two-dimensional nucleation until the desired film thickness is obtained. This growth by two-dimensional nucleation can be repeated with different polytypic compounds to produce a layered structure with two or more crystal films. If additional layers are desired, then it is preferred that conditions at the end of the growth of a given polytypic layer be altered to minimize two-dimensional nucleation so that the entire surface is atomically-flat, or nearly atomically-flat, for the subsequent growth of the next layer of a different polytypic crystal film.

A specific application of this invention is the growth of 3C-SiC on a 6H-SiC substrate. Another application is the growth of 2H-GaN on a 6H-SiC substrate. An example of a two-layer crystal film is 2H-GaN on top of 2H-AlN on top of a 6H-SiC substrate. In this case, the AlN acts as a buffer layer between the GaN and SiC for better lattice matching. Other SiC polytypes, such as 4H-SiC could also be used as substrates in the practice of this invention.

The present invention is based on our discovery that two-dimensional nucleation on SiC substrates can be reduced to zero, or near zero, for a wide range of growth conditions if the SiC substrate is properly prepared. Based on prior art processes, two-dimensional nucleation occurs on atomic-scale terraces (on the order of a micrometer wide) on SiC substrates, whereas with SiC substrates prepared according to the teachings of the present invention, two-dimensional nucleation has been reduced to zero, or nearly zero, over regions of the order of a millimeter wide. When growth by two-dimensional nucleation is carried out on atomically-flat surfaces, then under proper growth conditions, all crystal islands that nucleate will have the same rotational orientation; hence, the formation of defects will be eliminated, or dramatically reduced. Thus, the present invention can be applied to the growth of usefully large device-sized regions of low-defect films of 3C-Sic, 2H-AlN, and 2H-GaN on 6H-SiC substrates.

In the practice of our invention, important considerations to achieve growth with no two-dimensional nucleation are the following: contamination and surface defects must be minimized because they reduce the energy barrier that hinders two-dimensional nucleation. Also, line defects (dislocations) that intersect the growth surface must be minimized because some dislocations acts as localized step sources that can dominate growth on the mesas preventing the achievement of an atomically-flat, or nearly atomically-flat, mesa. A further teaching of the invention is that multiple rotational orientations of the polytypic stacking sequence can occur on surfaces with steps when a 2H or a 3C sequence is grown on a higher order polytypic substrate, such as a 4H or a 6H polytypic sequence. When crystal film islands, that have different rotational orientations, coalesce, then defects such as double positioning boundaries (DPB's) form at a boundary between the two domains. Another teaching of the present invention is that only a single orientation of the 3C polytype will form on an atomically-flat 6H sequence under suitable growth conditions. It is expected that this same behavior will hold for the 2H sequence grown on the 4H or 6H sequence.

BRIEF DESCRIPTION OF THE DRAWINGS

FIG. 5 is a cross-sectional view schematic drawing that illustrates atomic-scale growth steps that are produced when the polished growth surface is tilted off-axis by an angle θ relative to the basal plane.

FIG. 6 is a schematic diagram illustrating an atomically-flat surface of the present invention achieved after homoepitaxial step-flow growth without two-dimensions (2D) nucleation of a 6H-SiC film on a 6H-SiC substrate (under growth conditions that suppress 2D nucleation).

DETAILED DESCRIPTION OF THE PREFERRED EMBODIMENT

Figure 1:
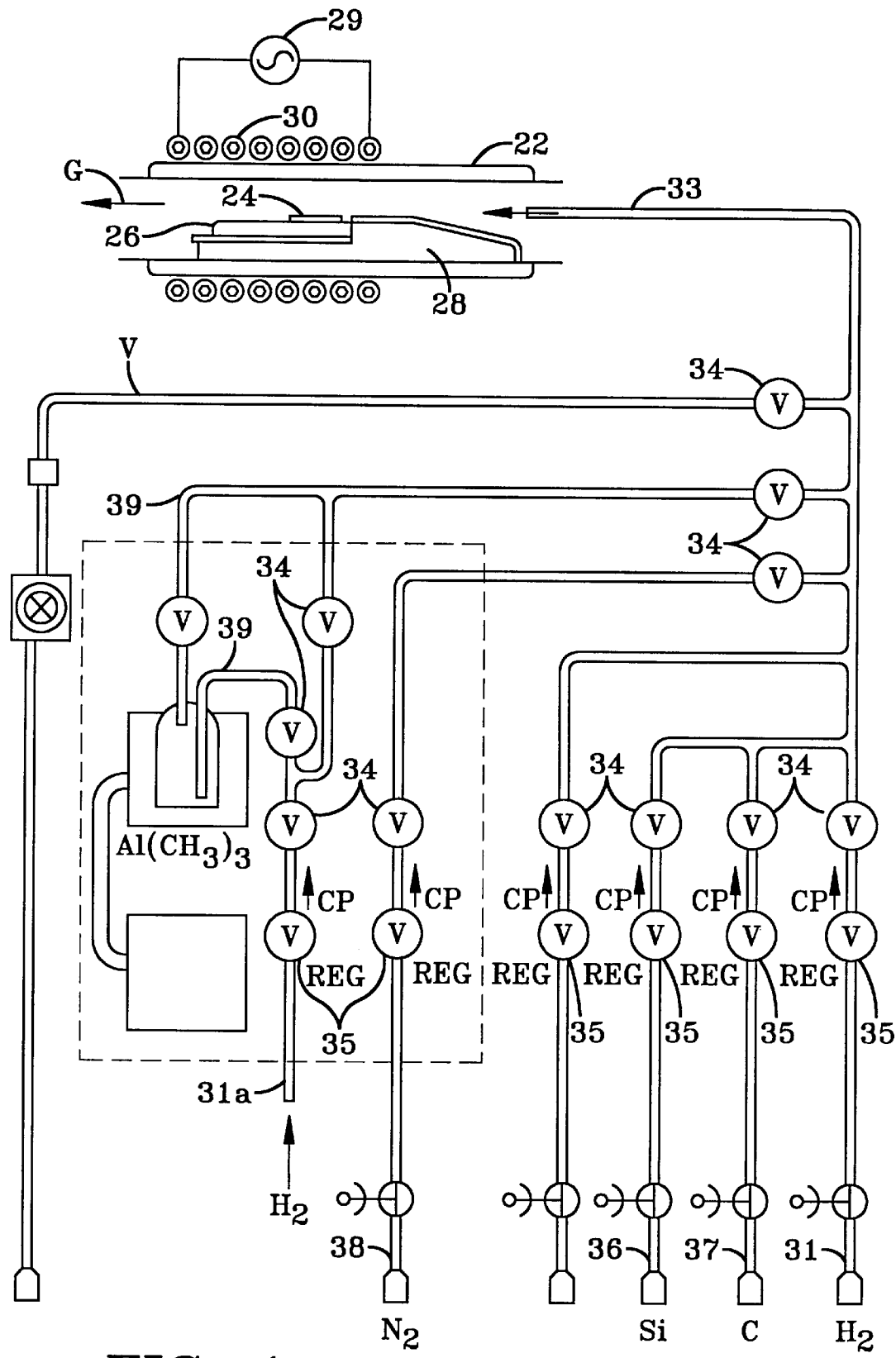
FIG. 1 is a schematic drawing of a CVD system employed for the growing crystal films in accordance with the present invention.

Referring now to the drawings, wherein the showings are for the purpose of illustrating preferred embodiments of the invention only and not for the purpose of limiting the same, the invention describes an improved chemical vapor deposition (CVD) method for obtaining improved quality of the grown crystal films. A prior art chemical vapor deposition (CVD) process is disclosed in U.S. Pat. No. 5,463,978 which is herein incorporated by reference. While the method of the present invention may be applied to many different crystals and is contemplated by the present invention, the method will be specifically described with respect to the growing of silicon carbide (SiC) crystals. The improved CVD method includes pretreating a substrate, heating the substrate in a reaction chamber, introducing a carrier gas, vaporizing the crystal growing compounds, introducing the vaporized compounds in the reaction chamber via the carrier gas, and maintaining proper energy levels and material flow rates in the reaction chamber for a sufficient time to grow a crystal film having a desired smooth surface morphology, a uniform thickness, a low-defect density and a controlled impurity profile. The crystals may be intentionally doped to form n-type and/or p-type crystals. The improved CVD crystal growing method is based on our discovery that atomically-flat basal-plane surfaces can be grown by step-flow growth (without two-dimensional (2D) nucleation) over a wide range of conditions provided the SiC substrate surface is properly prepared, and that two-dimensional nucleation growth on an atomically-flat basal-plane surface can produce 3C-SiC islands with a single rotational orientation.

The method of the invention can be carried out with a conventional chemical vapor deposition (CVD) system similar to that used in Si, SiC and GaAs semiconductor technology. The gases used in a SiC CVD system are hydrogen (used as a carrier gas), silane (used as a source of Si), propane (used as a source of C), HCl (used for cleaning and etching the substrate surface), nitrogen ($N_2$) (used as a n-type dopant), and trimethyl aluminum (TMA) (used as a p-type dopant). Other gases may be used as the Si or C source or used to dope the crystal. If organic compounds are used as the Si and C sources, the process is commonly referred to as metal-organic vapor phase epitaxy (MOVPE). Any CVD system that can deliver these gases to a suitable reaction chamber at the proper flow rates under high purity conditions and at the proper substrate temperatures can be used for the method of the present invention.

Referring now to FIG. 1, there is shown a schematic, partial view of one suitable CVD reaction system for carrying out the process of the invention. The CVD reaction system includes a reaction chamber 22 comprised of a double-walled quartz tube such that the inner quartz tube can be water-cooled. A SiC substrate 24 is supported by a SiC coated graphite susceptor 26, which, in turn, is supported by quartz support 28. To produce the desired temperature of the surface of substrate 24, a radio-frequency (RF) induction coil 30 is disposed around reaction chamber 22. Induction coil 30 is powered by frequency generator 29. The RF field produced by induction coil 30 heats substrate 24 via susceptor 26 to the desired temperature of the susceptor 26. When SiC film layers are grown, substrate 24 is preferably a SiC substrate. The gaseous crystal compounds are introduced into reaction chamber 22 by primary line 33. Primary line 33 is located at one end of reaction chamber 22 and directs the gases to flow in direction G across substrate 24 and out the opposite end of chamber 22. The various gaseous crystal compounds are connected to primary line 33 and the gas flow is regulated by valves 34 and regulators 35 connected to each gas line. Line 36 is the silicon gas line that controls the silane flow into primary line 33, and line 37 is the carbon gas line that controls the propane flow into primary line 33. The dopants are introduced into primary line 33 by line 38 and line 39. Line 38 is the n-type dopant line and preferably controls the nitrogen gas ($N_2$) flow rate. Line 39 is the p-type dopant line and preferably controls the trimethyl aluminum (TMA) flow rate. Carrier gas line 31 carries all the gaseous crystal compounds and dopants through primary line 33 and into reaction chamber 22. The carrier gas is preferably a gas such a hydrogen gas ($H_2$). Carrier gas line 31 is partially diverted into line 31*a* to supply line 39 so that the carrier gas can be bubbled through the liquid TMA. A vacuum line (V) connected to a vacuum can be connected to primary line 33 to evacuate reaction chamber 22 of gases.

Figure 2:
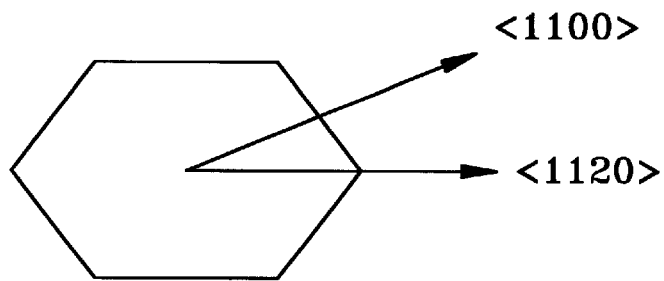
FIG. 2 illustrates a plan view of a 6H-SiC crystal showing the crystallographic axes of the crystal.
Figure 3:
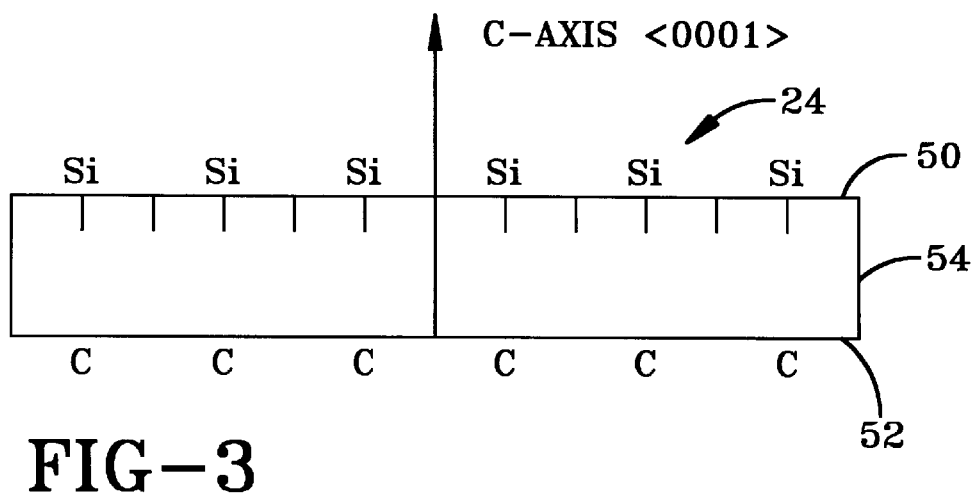
FIG. 3 is a cross-sectional view of a SiC substrate showing the Si-face, the C-face and the A-face of the substrate.

SiC substrate 24 is prepared by slicing a section from a SiC boule. Substrate 24 is cut such that the surface is slightly misoriented relative to the basal plane by tilt angle of less than 1°. The tilt direction is preferably toward the <1120> direction, as illustrated in FIG. 2, to produce the optimum growth rates and quality of the SiC epitaxial films grown on substrate 24. The surface of substrate 24 is polished preferably on one surface with a diamond paste and a final polish using a chemical-mechanical polishing technique. SiC substrate 24 has three faces, a Si-face 50, a C-face 52 and the A-face 54, as illustrated in FIG. 3. Preferably, Si-face 50 is polished and used for epitaxial growth. It has been found that Si-face 50 produces the highest-quality epitaxial layer films which have the best surface morphology and lowest defects.

Figure 4:
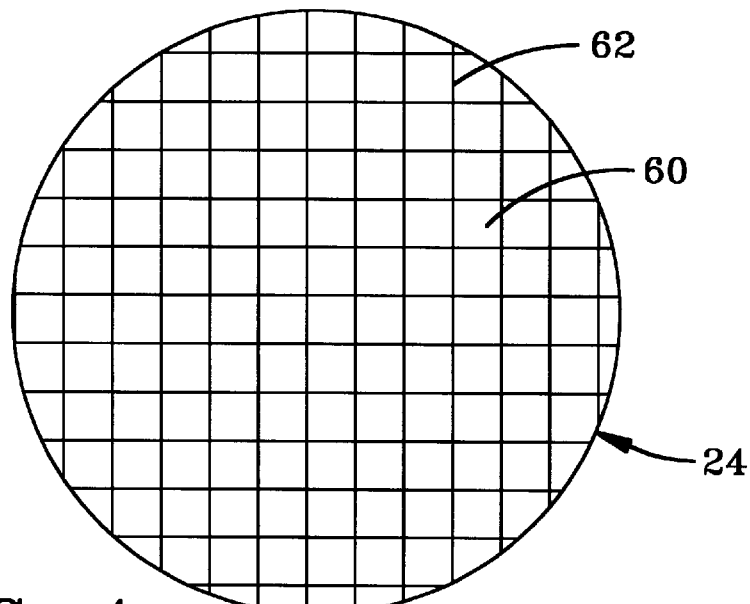
FIG. 4 is a plan view of a substrate that has been divided into isolated growth regions (mesas).

Substrate 24 is further prepared by creating boundaries or grooves 62 on the face of substrate 24 which form growth regions 60 (also called mesas), as illustrated in FIG. 4. Grooves 62 forming growth region boundaries 62 are preferably cut by physical means such as a precision dicing saw with a 25 micrometer thin blade to minimize crystal damage; however, boundaries 62 may be formed by other physical means such as photolithography, laser etching, ion etching and/or photochemical or electrochemical etching processes. The width of groove 62 need only be less than 10 micrometers, but larger widths can also be used. The depth of groove 62 is preferably about 50 micrometers, but may be deeper or shallower. Typically, an array of device-size regions, 1 millimeter×1 millimeter in size, is produced on the substrate 24. Other sizes, larger or smaller, can be produced.

Once the substrate surface has been polished and growth regions 60 have been formed, substrate 24 is pretreated to remove contaminants or impurities on the surface of the substrate so as to facilitate the growing of high-quality, low-defect epitaxial films. Various pregrowth treatments, such as oxidation, chemical mechanical polishing, or reactive ion etching, may be used to remove potential unwanted nucleation sites prior to growing the crystal epilayers. Then, substrate 24 is placed in reaction chamber 22. Prior to growing the crystal film layers on substrate 24, the substrate is pretreated with a pregrowth process to remove contaminants and defects on the surface of the substrate 24 that could act as unwanted sites for two-dimensional nucleation of the SiC film layers. These defects on the surface of the substrate can be generated during the cutting and polishing of the substrate. Preferably, the pregrowth process involves subjecting substrate 24 to a high temperature gaseous etch in a mixture of hydrogen chloride gas and hydrogen within the reaction chamber 22. The pregrowth process is such that the substrate is not altered in a way that unwanted sites for two-dimensional nucleation are produced on the surface of the substrate. Preferably, the etch uniformly removes material from the surface of substrate 24 to ensure a low-defect, highly-pure surface. A typical etch is carried out for about 20 minutes at a temperature of 1350° C. using about 3–4% hydrogen chloride gas in an $H_2$ carrier gas with a flow of about 3 liters per minute. Preferably, the concentration of the hydrogen chloride gas ranges between 1–5% during the pregrowth etch. Lower hydrogen chloride gas concentrations may not properly remove all the contaminants and surface defects from the substrate. Higher hydrogen chloride gas concentrations may produce a rough surface morphology or pits on the substrate, which may cause undesired nucleation sites throughout the surface of the substrate. The temperature during the etch ranges between 1200–1500° C. Lower temperatures would probably not properly eliminate two-dimensional nucleation sites. Temperatures greater than 1500° C. could too rapidly etch the substrate surface around the peripheral edge of the substrate and introduce unwanted two-dimensional nucleation sites upon the surface of the substrate.

Once substrate 24 has been pretreated, reaction chamber 22 is prepared for crystal growth. Reaction chamber 22 is preferably evacuated by vacuum via vacuum line V and subsequently purged with an inert gas to remove impurities. Hydrogen gas may be used to purge the reaction chamber. Once the reaction chamber is purged, the carrier gas flow rates and the temperature within the reaction chamber are brought to equilibrium. Hydrogen gas is preferably used as the carrier gas, but other gases (e.g., inert gases) can be used. Once the temperature and flow within the reaction chamber 22 have reached equilibrium, generally within less than one minute, silane and propane are added to the carrier gas to initiate Sic growth. Preferably, the silane concentration within the carrier gas is approximately 200 ppm resulting in a 200 ppm atomic concentration of Si. Preferably, the amount of propane introduced into the carrier gas is approximately 130 ppm to 600 ppm resulting in an atomic concentration of C between 390 ppm to 1800 ppm. The prescribed pretreatment of substrate 24 allows for significantly greater deviations from the optimum Si/C ratio than was previously thought possible for growing high-quality, low-defect SiC crystals. The ratio of the atomic concentrations of Si to C may be varied to create different growth rates and different growth conditions for Sic epilayers. The ratio may range between 0.1 and 0.8.

The first phase of crystal growth can be described by referring now to FIG. 5 where there is shown an atomic-scale cross-sectional drawing of 6H-SiC substrate 24 prior to the start of growth. FIG. 5 illustrates atomic-scale steps 41 that are present on the growth surface because of the tilt angle, θ, of the actual growth surface 42 (shown in phantom) relative to the crystal basal plane 43. In the first phase of the growth process (to produce an atomically-flat surface), growth conditions are set to promote step-flow growth, and to minimize growth by two-dimensional nucleation. These conditions consist of higher growth temperatures (1400 to 2200° C.) and lower concentrations of silane and propane. Growth of the first phase is continued until an atomically-flat, or nearly atomically-flat, epitaxial surface is obtained.

With reference to FIG. 6, there is shown an atomic-scale cross-sectional drawing of a 6H-SiC substrate after homoepitaxial step-flow growth (without 2D nucleation) has produced an epitaxial film 44 with an atomically-flat surface 45. Typically, SiC epilayer growth rates from a carrier gas containing 200 ppm silane and 600 ppm propane produce a vertical epilayer film growth rate parallel to the c-axis of about 3 micrometers per hour. At this vertical rate of growth, the lateral growth of steps is much higher and is inversely proportional to the tilt angle θ. The lateral growth rate for a 0.2° tilt angle and a 3 micrometer per hour vertical growth rate is 0.9 millimeters per hour; hence, at this rate, an atomically-flat epilayer can be grown over a 1 millimeter×1 millimeter square region in 70 minutes. This time can be reduced by using smaller tilt angles.

Figure 7:
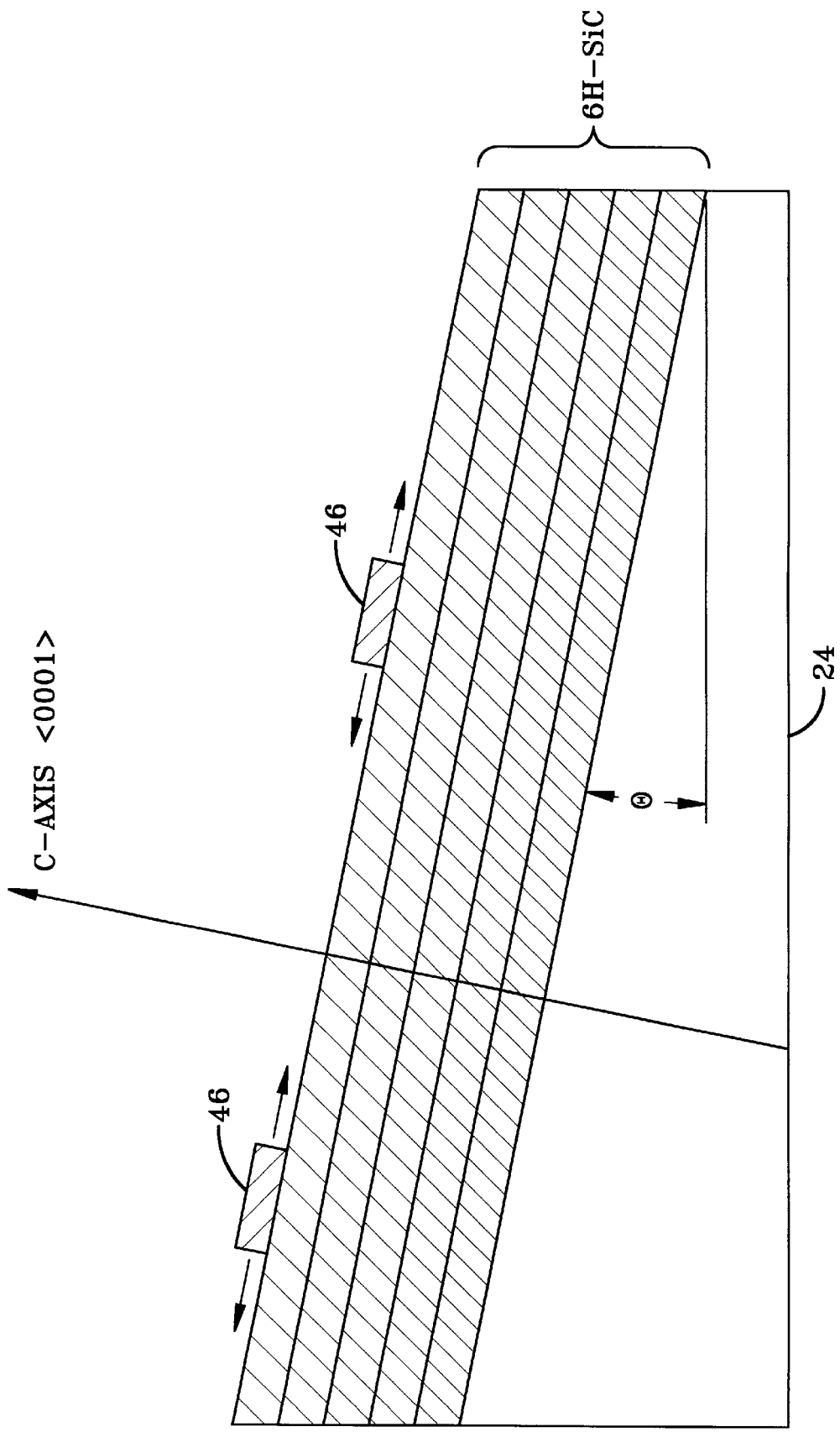
FIG. 7 is a cross-sectional view of a 6H-SiC substrate with two-dimensional nucleation of 3C-SiC islands on the atomically-flat growth surface.
Figure 8:
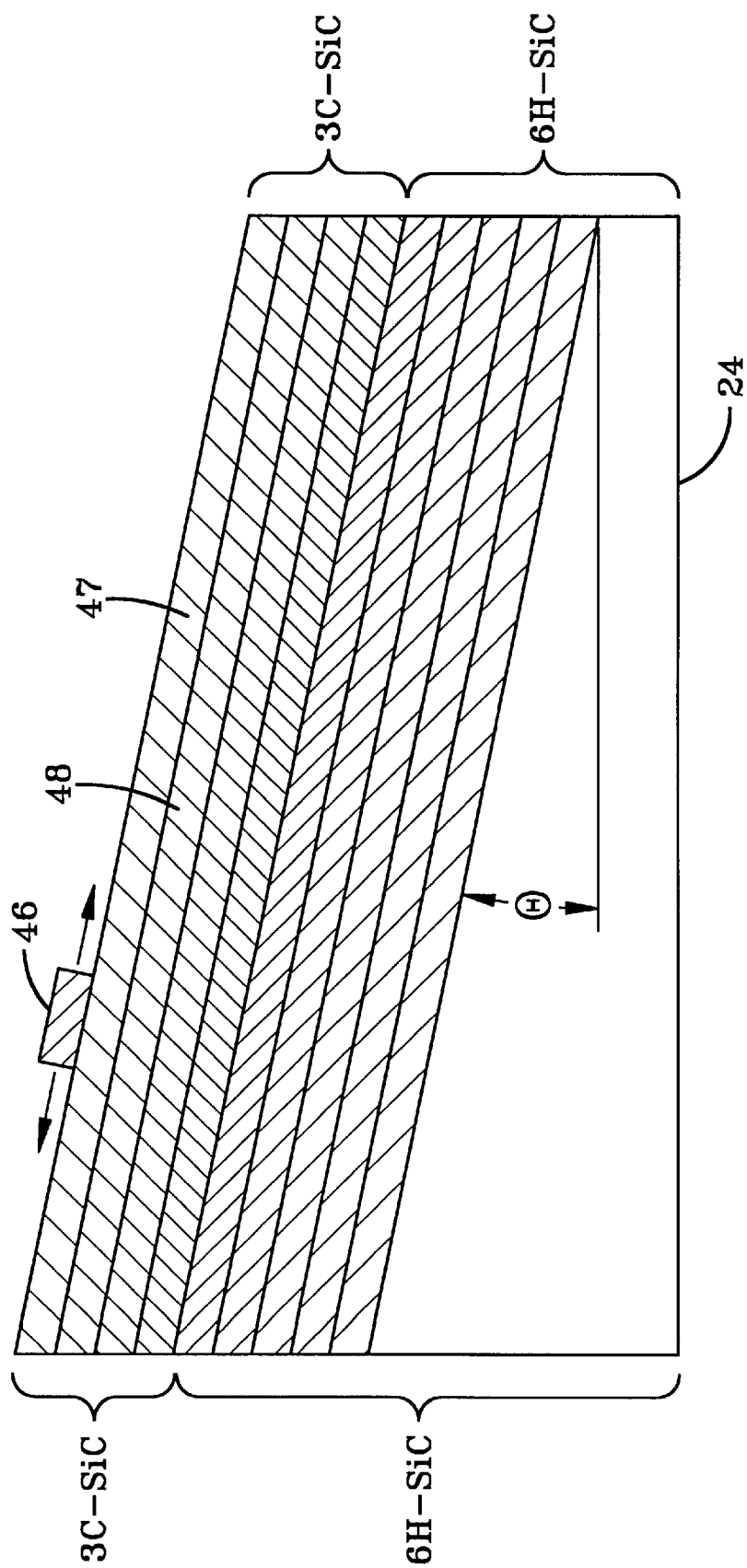
FIG. 8 is the substrate shown in FIG. 7 after growth of a 3C-SiC film using the mechanism of step flow growth with two-dimensional nucleation for the growth of each successive layer.

The heteroepitaxial growth of the desired film can be described by referring now to FIGS. 7 and 8 that illustrate this phase of the growth process, wherein 3C-SiC (see FIG. 8) epilayers are grown under conditions that promote two-dimensional nucleation in addition to step-flow growth on substrate 24 made of 6H-SiC (see FIG. 7) with an atomically-flat epilayer surface 45 (see FIG. 6). FIG. 7 illustrates the c-axis <0001> passing through the epilayer 6H-SiC. Conditions that promote two-dimensional nucleation include lower growth temperatures (800 to 1600° C.), higher concentrations of silane and propane, and higher Si/C ratios. Initially, as shown in FIG. 7, there are no atomic-scale steps, so 3C-SiC islands 46 nucleate as shown. These 3C-SiC islands 46 grow laterally by step-flow growth; as the islands 46 coalesce, an atomically-flat 3C-SiC epilayer surface 47 (see FIG. 8) is formed. However, under conditions that promote two-dimensional nucleation, 3C-SiC islands 46 will continue to form on the 3C-SiC epilayers 48. Hence, vertical growth proceeds by step flow with two-dimensional nucleation. Although there is some stress between the two polytype epilayers (3C-SiC and 6H-SiC (see FIG. 8)), the 3C-SiC film layers 48 have no double positioning boundaries (DPBs) and few, if any stacking faults because only one rotational orientation of 3C-SiC epilayer will form on the atomically-flat 6H-SiC substrate in a manner as to be described hereinafter with reference to FIGS. 9–11. The second phase of the growth illustrated in FIGS. 7 and 8 is continued until the desired thickness of 3C-SiC is obtained.

If an atomically-flat final surface on the 3C-SiC epilayer, such as layer 47 of FIG. 8, is desired, then growth conditions near the end of the growth of the desired film are altered to minimize two-dimensional nucleation so that 100-percent step-flow growth produces the desired atomically-flat film surface 47. This atomically-flat film surface 47 on the 3C-SiC epilayer can be used for growth of additional epilayers of other polytypic materials. With this approach, second-phase growth conditions (i.e., two-dimensional nucleation plus step flow) can be used to produce multiple layers of different polytypes. Each polytype will have its own set of second phase growth conditions. Thus, the application of second-phase growth is repeated until the desired multi-layer structure is obtained.

Figure 9:
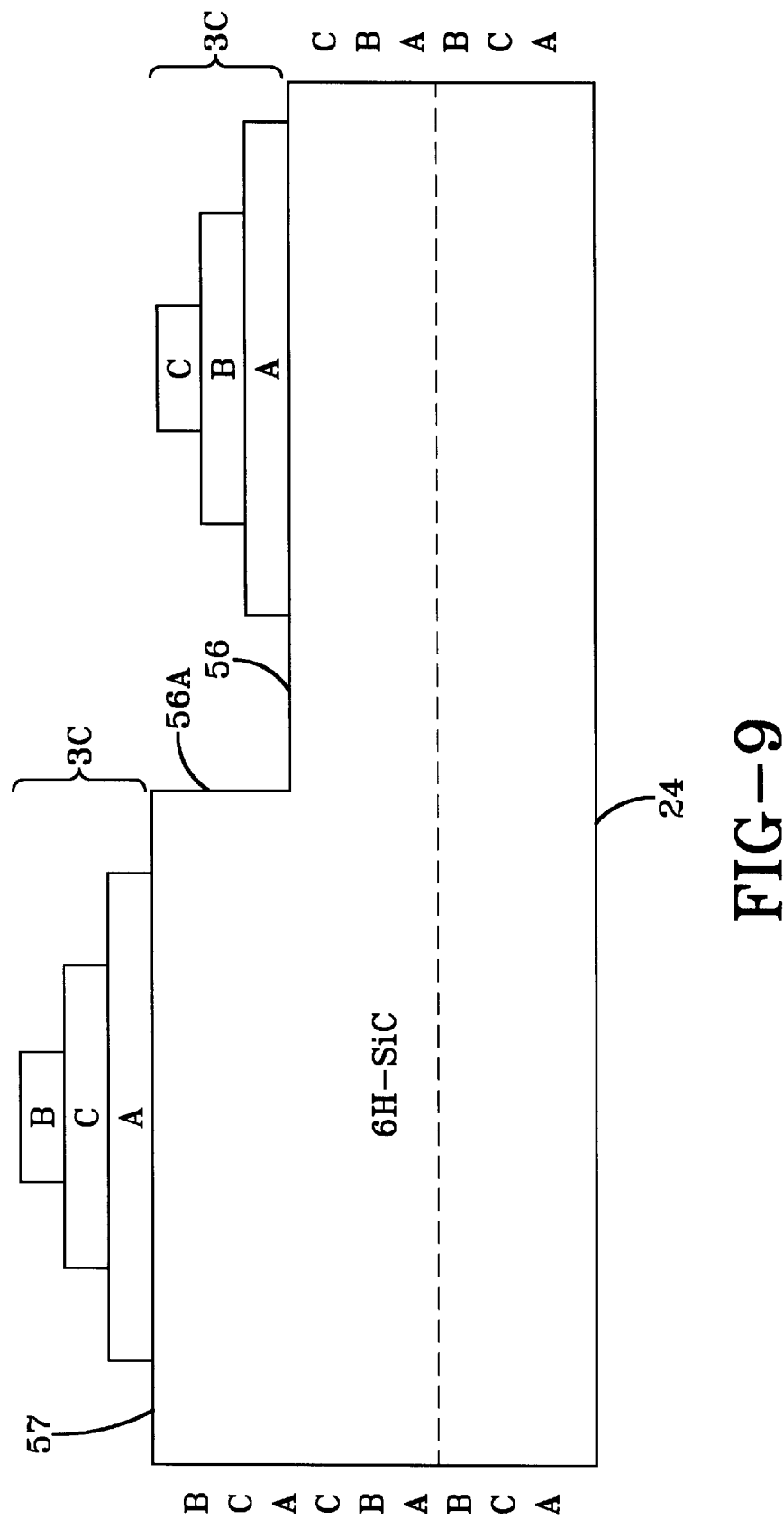
FIG. 9 is a cross-sectional view of a 6H-SiC substrate with an atomic-scale step and which illustrates how two-dimensional nucleation on such a stepped surface leads to the nucleation of 3C-SiC islands with two different rotational orientations.

The rotational orientation may be further described with reference to FIG. 9 which illustrates schematically how different rotational orientations of 3C-SiC can nucleate and grow on a 6H-SiC substrate with steps. As illustrated in FIG. 9, the 3C-SiC orientation ABCABC . . . is formed on the lower terrace 56, while the 3C-SiC orientation ACBACB . . . is formed on the upper terrace 57. The two 3C-SiC orientations ABCABC and ACBACB are rotated 60° with respect to one another and are respectively repeated as shown in FIG. 9 which also illustrates a step 56A between the terraces 56 and 57.

Figure 10:
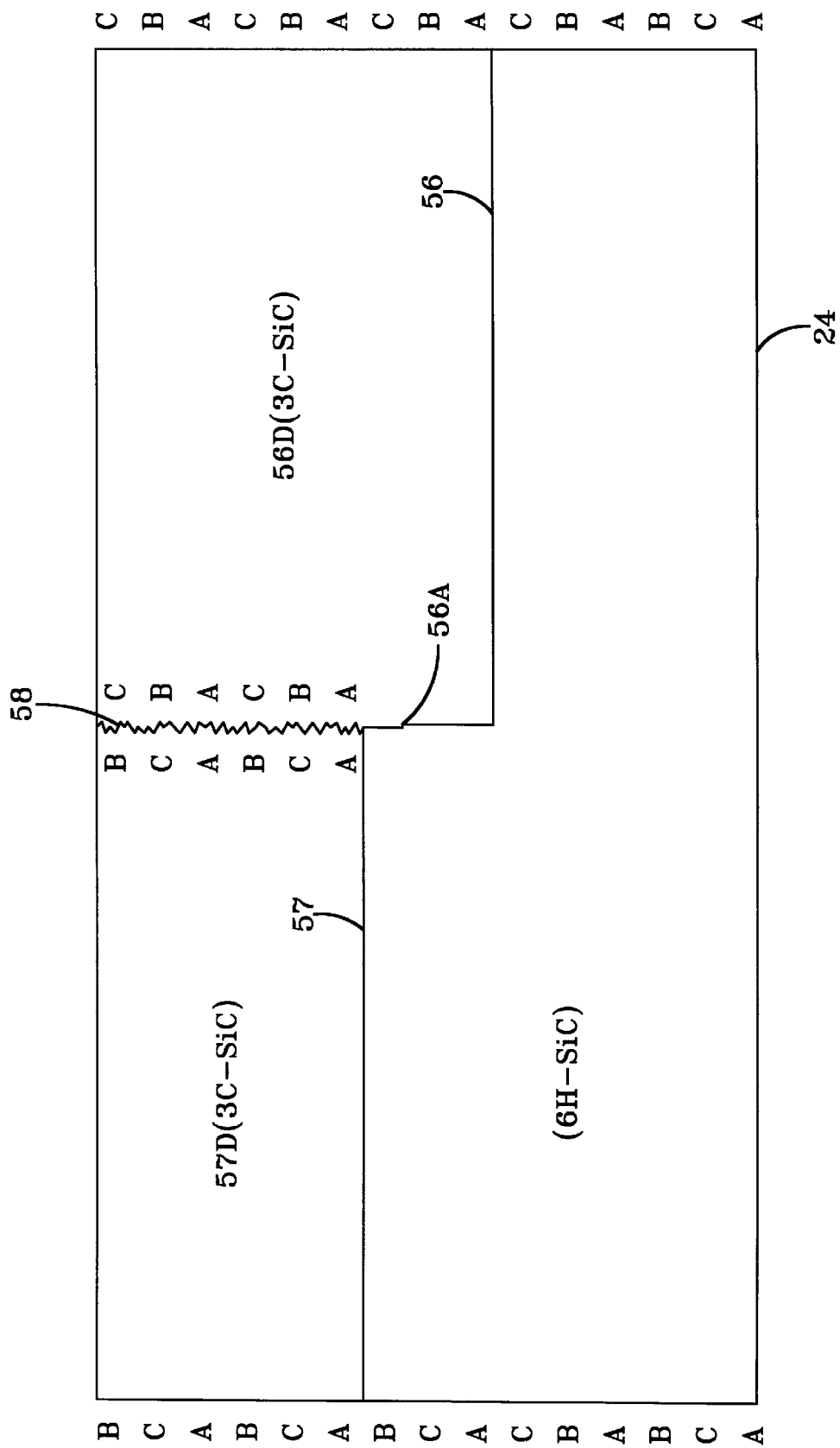
FIG. 10 is a cross-sectional view of the crystal shown in FIG. 9 after additional crystal growth and which shows how a defect known as double positioning boundaries (DPB's) are created when islands with differing rotational orientations grow together.

The double positioning boundaries (DPBs) of the 3C-SiC films of the present invention may be further described with reference to FIG. 10 which illustrates schematically how double positioning boundaries (DPBs) are created when islands, shown as 57D (3C-SiC) and 56D (3C-SiC) located on terraces 57 and 56, respectively grow together. Both of the terraces 56 and 57 are shown as laying on the epilayer 6H-SiC. Two out of three atomic layers do not match-up between islands 57D and 56D. More particularly, only layer A of the orientations ABC and ACB matches up with respect to rotational orientation. Because of this mis-match, double positioning boundaries (DPBS) are created and are shown by the jagged line 58 in FIG. 10. The double positioning boundaries (DPBs) are electrically active and tend to prevent the epitaxial film from being used in a useful controlled manner. The practice of the present invention, as to be more fully described below, eliminates these undesired double positioning boundaries (DPBs).

In the practice of the present invention, in an experimental verification of one important aspect of the invention, a Lely-grown 6H-SiC crystal was used as a substrate 24. A Lely crystal was chosen because this type of SiC crystal generally has much fewer micropipes and dislocations than SiC crystals obtained from sublimation-grown boules. It is desirable to choose substrates with a minimum of defects that can act as sites of unwanted two-dimensional nucleation or unwanted source of steps during the first growth phase of the invention which is the growth of atomically-flat regions. The Si-face surface, such as face 50 of FIG. 3, of this crystal was polished such that the tilt angle of the polished growth surface was approximately 0.33° with respect to the basal plane. An array of 1 millimeter by 1 millimeter square growth mesas was produced on the Lely crystal growth surface by sawing grooves, such as grooves 62 of FIG. 4, approximately 50 micrometers wide by 30 micrometers deep with a dicing saw. A one-hour epitaxial growth was carried out at 1500° C. with this substrate with a Si/C ratio of 0.44 and the result was an atomically-flat, or nearly atomically-flat region, approximately 1 millimeter by 0.5 millimeter, on some of the mesas. There was some evidence of a very thin 3C-SiC epilayer, much less than 1 micrometer thick, on the atomically-flat area. Mesas without atomically-flat regions had large shallow 6H-SiC hillocks caused by step-flow growth from screw dislocations along the edge of the groove 62; most likely these screw dislocations were caused by damage created by the dicing saw blade. This result demonstrates that, for substrates without screw dislocations and other significant defects, device-sized atomically-flat regions can be grown under the proper growth conditions. Subsequent epitaxial growth on this substrate, such as substrate 24 of FIG. 1, produced thicker 3C-SiC epilayers with no double positioning boundaries (DPBS, such as those of FIG. 10), and dramatically reduced stacking fault density. On one of the mesas, the 3C-SiC film had no stacking faults. This result demonstrates that 3C-SiC epilayers grown on atomically-flat substrates in accordance with the present invention have much lower defect density than 3C-SiC epilayers grown by prior art processes.

In the practice of the present invention an experimental observation was performed to verify another important aspect of the invention. Epitaxial growth was carried out on a 6H-SiC substrate that was obtained from a sublimation-grown boule. This substrate was polished on the Si face, such as face 50 of FIG. 3, and had a growth surface with a tilt angle of about 0.2° with respect to the basal plane. This substrate, such as substrate 24 of FIG. 1, also had a high density of screw dislocations since it was a boule-derived sample. The resulting epitaxial film had numerous shallow hillocks produced by step-flow growth of new steps emanating from the screw dislocation as the film grew and which may be further described with reference to FIG. 11.

Figure 11:
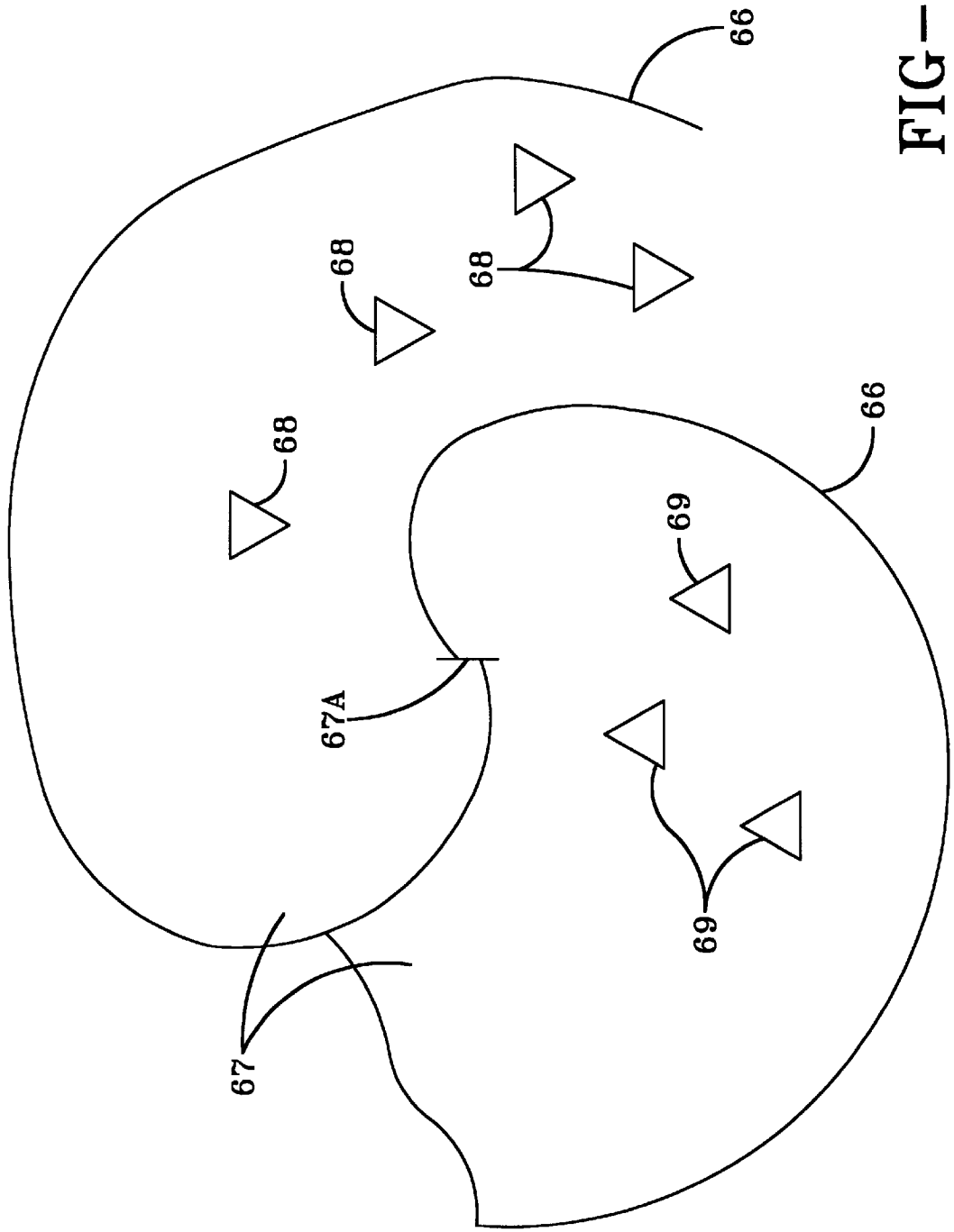
FIG. 11 is drawing of two-dimensional nucleation of 3C-SiC islands observed on adjacent basal-plane terraces on a 6H-SiC crystal where the spiral growth steps are produced by a screw dislocation in the 6H-SiC crystal. Islands on the same terrace have the same rotational orientation.

FIG. 11 illustrates a plurality of spiral growth steps 66 interconnected at the center 67A and seen with atomic force microscopy (AFM) in the vicinity of the screw dislocation previously discussed. The spiral lines 66 are growth steps, 0.75 nm high (the c-axis repeat distance of 3C-SiC), separating adjacent spiral terraces 67. Each spiral terrace 67 is substantially atomically-flat. FIG. 11 shows a plurality of triangle symbols that represent 3C-SiC islands 68 and 69. As seen in FIG. 11, all islands 68 on the same terrace 67 have the same orientation and, similarly all islands 69 on the same terrace 67 have the same orientations. Conversely, the islands 68 and 69 are rotated 180° with respect to each other; 3C-SiC islands 68 and 69 have nucleated on the atomically-flat terraces 67 due to the particular growth conditions. The orientation of the triangles 68 and 69 shown in FIG. 11 is an indicator of the orientation of the 3C-SiC island 68 or 69. From FIG. 11, in particularly illustrated islands 68 and 69, it may be concluded that all 3C-SiC epilayers that nucleates on an atomically-flat growth surface will have the same rotational orientation under proper growth conditions.

It is contemplated that the present invention is applicable to commercially available boule-derived wafers because the micropipe and dislocation density of the commercial wafer is steadily being reduced as was the case for silicon wafers many years ago. In a paper entitled "Recent Progress in SiC Crystal Growth," presented by V. F. Tsvetkov, et al of Cree Research, Inc., at the Silicon Carbide and Related Materials 1995 Conf., in Kyoto, Japan, it was reported that the micropipe and dislocation densities in their laboratory 6H-SiC wafers have been reduced by about 10× in the last several years. Hence, as this trend continues, the commercial wafers should be very suitable substrates.

All descriptions of the preferred embodiment so far have only described the growth of 3C-SiC films on 6H-SiC substrates. Another important application of the invention is the growth of low-defect single-crystal films of AlN and GaN. These are important optoelectronic and high temperature and high frequency electronic materials. In fact, research on these nitrides has expanded dramatically over the last several years because of their potential use in the fabrication of short-wavelength diode lasers.

The invention can be readily applied to the growth of AlN and/or GaN on Sic substrates because these nitrides are fairly closely lattice-matched to SiC. The process of the present invention can be modified for nitride growth in the following manner. The substrate can be 6H-SiC, and can be processed as was described for the growth of 3C-SiC. All process procedures up through the growth of atomically-flat 6H-SiC epilayers would be carried out. Then, the procedures that are known to those skilled in the art of nitride growth could be applied to the specially prepared 6H-SiC substrate, with atomically-flat regions. The advantage of the atomically-flat growth surfaces provided by the practice of the present invention is that the nitride islands that nucleate will have the same orientation, rather than random orientations that occurs in growth on substrates with atomic-scale steps. There are various combinations of growth procedures that can be used. For example, AlN, GaN, or AlGaN could be grown directly on the atomically-flat 6H-SiC mesas, or AlN could be used as a buffer layer between a GaN epilayer and the 6H-SiC substrate. In either case, the defect density in the nitride epilayers should be significantly lower than obtainable in epilayers grown by prior processes on commercially available SiC or sapphire substrates.

As is known in the art, it is common practice to insert additional heteroepitaxial layers that serve as buffer layers to reduce stress and defects between heteroepitaxial films. AlN and AlGaN are examples of buffer layers used for growth of GaN on SiC and sapphire.

An advantage of epilayers grown with this invention is that the epilayer surfaces on each growth region are atomically-flat or nearly atomically-flat. In contrast, epilayers grown on SiC substrates using prior art processes result in surface with larger surface steps (tens of nanometers high) formed by the "step bunching" of smaller atomic-scale steps (approximately 1 nanometer high).

The invention has been described with reference to a preferred embodiment and alternates thereof. It is believed that many modifications and alterations to the embodiment as discussed herein will readily suggest themselves to those skilled in the art upon reading and understanding the detailed description of the invention. It is intended to include all such modifications and alterations insofar as they come within the scope of the present invention.

What we claim is:

1. A method of producing single-crystal atomically-flat surfaces on a single-crystal SiC substrate, said method comprising the steps of:
   (a) preparing a planar growth surface on said substrates that is parallel to within a predetermined angle relative to a selected crystal plane of said substrate;
   (b) removing material in said substrate so as to define at least one selected separated area having boundaries;
   (c) treating said substrate so as to remove any sources of unwanted crystal nucleation and remove any unwanted sources of steps;
   (d) depositing a homoepitaxial film over said at least one selected separated area under selected conditions so as to provide a step-flow growth while suppressing two-dimensional nucleation; and
   (e) continuing said deposition of said homoepitaxial film until said step-flow growth obtains an atomically-flat epitaxial film surface on each of said at least one separated area where said atomically-flat surface is parallel to said selected crystal plane.

2. The method of claim 1, wherein said at least one separate area comprises an array of separated areas.

3. The method of claim 2, wherein size of said separated areas are approximately equal to that of one of desired semiconductor devices and integrated circuits.

4. The method of claim 1, wherein said any source of unwanted crystal nucleation are contributed to by said single crystal substrate and by said steps (a) and (b).

5. The method of claim 1, wherein said any source of unwanted steps are contributed to by said crystal substrate and steps (a) and (b).

6. The method according to claim 1, wherein said single crystal substrate is selected from the group comprising polytypes of silicon carbide.

7. The method according to claim 1 further comprising the steps:
   (f) depositing a desired heteroepitaxial film on said homoepitaxial film under predetermined conditions that preferably cause two-dimensional nucleation accompanied by step-flow growth of said desired heteroepitaxial film
   (g) continuing said depositing of said step (f) of said heteroepitaxial film until a desired thickness is obtained.

8. The method according to claim 1, wherein said predetermined angle is less than 1 degree.

9. The method according to claim 1, wherein the said single-crystal substrate is alpha-SiC.

10. The method according to claim 9, wherein the said single-crystal substrate is 6H-SiC.

11. The method according to claim 9, wherein the said single-crystal substrate is 4H-SiC.

12. The method according to claim 7, wherein the said heteroepitaxial film is 3C-SiC.

13. The method according to claim 7, wherein, the said heteroepitaxial film is GaN.

14. The method according to claim 7, wherein the said heteroepitaxial film is AlN.

15. The method according to claim 7, wherein said heteroepitaxial film is AlGaN.

16. The method according to claim 1, wherein said substrate of step (c) is subjected to an etch in a gaseous mixture of hydrogen chloride and hydrogen at a temperature greater than 1000° C. to remove sources of unwanted crystal nucleation.

17. The method according to claim 1, wherein said step (b) is accomplished by forming grooves.

18. The method according to claim 1, wherein said step (b) is accomplished by physical means.

19. The method according to claim 18, wherein said physical means is selected from the group comprising a dicing saw, ultrasonic cutting devices, photolithography, laser etching, ion etching, photochemical etching, electrochemical etching, and photoelectrochemical etching.

20. The method according to claim 1, wherein said step (b) is accomplished by cutting the said substrate apart.

21. The method according to claim 7, wherein said heteroepitaxial film comprises SiC and further comprising the steps:

(h) continuing the growth of the said heteroepitaxial film under selected conditions so as to provide a step flow growth while suppressing two-dimensional nucleation; and (i) continuing said deposition of said heteroepitaxial film until said step-flow growth obtains an atomically-flat epitaxial film surface on each of said at least one separated area where said atomically-flat surface is parallel to said selected crystal plane.

22. The method according to claim 21, wherein said multiple heteroepitaxial films comprise adjacent layers that are brought together with a buffer layer that reduces the stress between adjacent layers.

23. The method according to claim 1, wherein said steps (a)–(e) of claim 1 provide said atomically flat surface that is used to produce a product which has a semiconductor device structure.

24. The method according to claim 1, wherein said selected crystal plane is the basal (0001) plane.

* * * * *